US012709796B2

(12) United States Patent
Kachel

(10) Patent No.: US 12,709,796 B2
(45) Date of Patent: Aug. 18, 2026

(54) METHODS OF FILLING A RECESSED FEATURE ON A SUBSTRATE EMPLOYING METAL SEQUENTIAL INFILTRATION SYNTHESIS PROCESSES

(71) Applicant: ASM IP Holding B.V., Almere (NL)

(72) Inventor: Krzysztof Kamil Kachel, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 19/185,384

(22) Filed: Apr. 22, 2025

(65) Prior Publication Data

US 2025/0333837 A1 Oct. 30, 2025

Related U.S. Application Data

(60) Provisional application No. 63/638,747, filed on Apr. 25, 2024.

(51) Int. Cl.
*C23C 16/04* (2006.01)
*C23C 16/02* (2006.01)
*C23C 16/08* (2006.01)
*C23C 16/56* (2006.01)

(52) U.S. Cl.
CPC ........ *C23C 16/045* (2013.01); *C23C 16/0272* (2013.01); *C23C 16/08* (2013.01); *C23C 16/56* (2013.01)

(58) Field of Classification Search
CPC ..... C23C 16/045; C23C 14/046; C23C 16/06; C23C 16/14; C23C 16/45553; H01L 21/76802; H10P 14/6339
See application file for complete search history.

(56) References Cited

U.S. PATENT DOCUMENTS

| | | | |
|---|---|---|---|
| 8,956,971 | B2 | 2/2015 | Haukka |
| 9,257,303 | B2 | 2/2016 | Haukka |
| 9,679,808 | B2 | 6/2017 | Haukka |
| 9,895,715 | B2 | 2/2018 | Haukka |
| 10,049,924 | B2 | 8/2018 | Haukka |
| 10,177,025 | B2 | 1/2019 | Pore |
| 10,343,186 | B2 | 7/2019 | Pore |
| 10,373,820 | B2 | 8/2019 | Tois |
| 10,453,701 | B2 | 10/2019 | Tois |
| 10,456,808 | B2 | 10/2019 | Haukka |
| 10,695,794 | B2 | 6/2020 | Pore |
| 10,814,349 | B2 | 10/2020 | Pore |
| 10,854,460 | B2 | 12/2020 | Tois |
| 10,923,361 | B2 | 2/2021 | Tois |
| 11,081,342 | B2 | 8/2021 | Färm et al. |
| 11,094,535 | B2 | 8/2021 | Tois |
| 11,145,506 | B2 | 10/2021 | Maes |
| 11,213,853 | B2 | 1/2022 | Haukka |
| 11,387,107 | B2 | 7/2022 | Tois |
| 11,389,824 | B2 | 7/2022 | Pore |
| 11,450,529 | B2 | 9/2022 | Longrie |

(Continued)

*Primary Examiner* — Tabassom Tadayyon Eslami
(74) *Attorney, Agent, or Firm* — Snell & Wilmer L.L.P.

(57) ABSTRACT

Methods for filling a recessed feature on a substrate employing metal sequential infiltration synthesis processes are disclosed. The disclosed methods include forming an organic layer within a recessed feature and introducing metal species into the organic layer to allow the formation of a metal seed layer. A bulk metal layer can subsequently be formed from the metal seed layer to fill the recessed feature.

20 Claims, 4 Drawing Sheets

(56) References Cited

U.S. PATENT DOCUMENTS

| | | | | |
|---|---|---|---|---|
| 11,694,903 | B2 | 7/2023 | Ritala | |
| 2017/0352550 | A1* | 12/2017 | Tois | C23C 16/45553 |
| 2018/0033679 | A1 | 2/2018 | Pore | |
| 2020/0105515 | A1 | 4/2020 | Maes | |
| 2020/0324316 | A1 | 10/2020 | Pore | |
| 2021/0115559 | A1 | 4/2021 | Sharma | |
| 2021/0175092 | A1 | 6/2021 | Tois | |
| 2021/0301391 | A1 | 9/2021 | Givens | |
| 2021/0351031 | A1 | 11/2021 | Färm | |
| 2021/0358739 | A1 | 11/2021 | Tois | |
| 2021/0358745 | A1 | 11/2021 | Maes | |
| 2022/0068634 | A1 | 3/2022 | Deng | |
| 2022/0084817 | A1 | 3/2022 | Sharma | |
| 2022/0181163 | A1 | 6/2022 | Illiberi | |
| 2022/0193720 | A1 | 6/2022 | Haukka | |
| 2022/0208542 | A1 | 6/2022 | Maes | |
| 2023/0098114 | A1 | 3/2023 | Tois | |
| 2023/0139917 | A1 | 5/2023 | Tois | |
| 2023/0140367 | A1 | 5/2023 | Madhiwala | |
| 2023/0140812 | A1 | 5/2023 | Daniele | |
| 2023/0178371 | A1 | 6/2023 | Shaoren | |
| 2023/0227965 | A1 | 7/2023 | Deng | |
| 2024/0395894 | A1* | 11/2024 | Chen | H10D 64/62 |

* cited by examiner

METHODS OF FILLING A RECESSED FEATURE ON A SUBSTRATE EMPLOYING METAL SEQUENTIAL INFILTRATION SYNTHESIS PROCESSES

CROSS-REFERENCE TO RELATED APPLICATIONS

This application is a nonprovisional of, and claims priority to and the benefit of, U.S. Provisional Patent Application No. 63/638,747, filed Apr. 25, 2024 and entitled "METHODS OF FILLING A RECESSED FEATURE ON A SUBSTRATE EMPLOYING METAL SEQUENTIAL INFILTRATION SYNTHESIS PROCESSES," which is hereby incorporated by reference herein.

FIELD

The present disclosure relates generally to the field of semiconductor processing methods, and associated structures and to the field of device and integrated circuit manufacture. More particularly the present disclosure generally relates methods of filling a recessed feature on a substrate employing metal sequential infiltration synthesis processes.

BACKGROUND

Fabrication processes for forming device structures, such as, for example, transistors, memory elements, and integrated circuits, are wide ranging and may include deposition, etch, thermal, lithography, and doping processes, amongst others.

A particular fabrication process involves the deposition of a material into a recessed feature on a substrate, thereby filling the recessed feature (or gap) with the material, a process commonly referred to as "gap-fill." For example, a non-planar substrate may comprise a multitude of recessed features, such as vertical recessed features disposed between protruding portions of a substrate surface or indented recessed features formed into a substrate surface.

As semiconductor device structure geometries decrease and high aspect ratio features have become more common place in such device structures as DRAM, flash memory, and logic, it has become increasingly complex to fill the multitude of recessed features with a material having the desired characteristics.

Deposition methods such as high-density plasma (HDP), sub-atmospheric chemical vapor deposition (SACVD), and low-pressure chemical vapor deposition (LPCVD) have been employed in gap-fill processes, but these and other processes commonly do not achieve the desired gap-fill results. Accordingly, methods are desired for filling recessed features on a substrate with a material, such as a metal, with improved characteristics.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

BRIEF SUMMARY

This summary introduces a selection of concepts in a simplified form, which are described in further detail below. This summary is not intended to necessarily identify key features or essential features of the claimed subject matter, nor is it intended to be used to limit the scope of the claimed subject matter.

Various embodiments of the present disclosure relate to methods of filling a recessed feature on a substrate as well methods of bottom-up gap filling a recessed feature on a substrate.

In accordance with examples of the disclosure a method of filling a recessed feature on a substrate is provided. The method includes seating a substrate including a recessed feature within a reaction chamber. In such methods, the recessed feature includes a sidewall surface, a top surface, and a bottom surface. In such methods, the bottom surface includes a first material, and the sidewall surface includes a second material different from the first material. The method also includes selectively forming an organic layer on the first material relative to the second material and performing a metal sequential infiltration synthesis process to introduce metal species into the organic layer thereby forming a metal infiltrated layer. The method also includes removing organic components of the metal infiltrated layer thereby forming a metal seed layer on the bottom surface and forming a bulk metal layer directly on the metal seed layer, wherein the bulk metal layer fills the recessed feature.

In some embodiments, selectively forming the organic layer on the first material relative to the second material includes selectively passivating a surface of the second material relative to a surface of the first material by introducing a passivating agent into the reaction chamber and depositing the organic layer on the surface of the first material.

In some embodiments, the organic layer is selectively formed with a selectivity greater than 50 percent.

In some embodiments, the passivating agent comprises an alkylaminosilane. In some embodiments, the alkylaminosilane comprises at least one of allyltrimethylsilane (TMS-A), 1,1,1-Trimethoxy-N,N-dimethylsilanamine, chlorotrimethylsilane (TMS-Cl, N-(trimethylsilyl)imidazole (TMS-Im), octadecyltrichlorosilane (ODTCS), hexamethyldisilazane (HMDS), N-(trimethylsilyl)dimethylamine (TMSDMA), 1,1,1-Trimethoxy-N,N-dimethylsilanamine, trimethylchlorosilane, and combinations thereof.

In some embodiments, the method further includes thermally treating the organic layer in an ammonia ($NH_3$) ambient prior to performing the metal sequential infiltration synthesis process.

In some embodiments, performing the metal sequential infiltration synthesis process includes introducing a metal precursor into the reaction chamber, the metal precursor containing the metal species. In some embodiments, the metal species is selected from a group consisting of titanium, aluminum, niobium, tungsten, tantalum, cobalt, ruthenium, and molybdenum.

In some embodiments, performing the metal sequential infiltration synthesis process further includes introducing a second precursor into the reaction chamber, the second precursor comprising hydrogen or ammonia.

In some embodiments, removing organic components of the metal infiltrated layer includes a plasma etch process.

In some embodiments, forming the bulk metal layer directly on the metal seed layer includes depositing the bulk metal layer by a cyclical deposition process.

In some embodiments, the bulk metal layer includes titanium, aluminum, niobium, tungsten, tantalum, cobalt, ruthenium, and molybdenum. In some embodiments, the bulk metal layer is the same as the metal seed layer. In some embodiments, the bulk metal layer is different to the metal seed layer.

In accordance with additional examples of the disclosure, a method of bottom-up gap filling of a recessed feature on a substrate is provided. The method includes seating a substrate including a recessed feature within a reaction chamber. The recessed feature includes a bottom surface comprising a silicon germanium layer and a sidewall surface comprising a silicon layer. The method also includes passivating the sidewall surface including the silicon layer by introducing a passivating agent into the reaction chamber. The method also includes depositing an organic layer on the silicon germanium layer disposed at the bottom surface of the recessed feature. The method also includes performing at least one infiltration cycle of a sequential infiltration synthesis (SIS) sequence to introduce metal species into the organic layer thereby forming a metal infiltrated layer. Each infiltration cycle includes introducing a metal precursor containing the metal species into the reaction chamber, the metal species selected from a group consisting of titanium, aluminum, niobium, tungsten, tantalum, cobalt, ruthenium, and molybdenum. The method also includes removing organic components of the metal infiltrated layer thereby forming a metal seed layer on the silicon germanium layer disposed at the bottom surface of the recessed feature. The method also includes depositing a bulk metal layer directly on the metal seed layer employing a cyclical deposition process, where the bulk metal layer fills the recessed feature without the formation of a seam.

In some embodiments, the passivating agent includes an alkylaminosilane selected from a group consisting of allyltrimethylsilane (TMS-A), 1,1,1-Trimethoxy-N,N-dimethylsilanamine, chlorotrimethylsilane (TMS-Cl), N-(trimethylsilyl)imidazole (TMS-Im), octadecyltrichlorosilane (ODTCS), hexamethyldisilazane (HMDS), N-(trimethylsilyl)dimethylamine (TMSDMA), 1,1,1-Trimethoxy-N,N-dimethylsilanamine, trimethylchlorosilane, and combinations thereof.

In some embodiments, the organic layer comprises a polyimide.

In some embodiments, the method further includes thermally annealing the organic layer in an ammonia (NH3) ambient prior to performing at least one infiltration cycle of the sequential infiltration synthesis (SIS) sequence.

In some embodiments, the metal seed layer is a molybdenum seed layer, and the bulk metal layer is a bulk molybdenum layer. In some embodiments, the metal seed layer is a titanium seed layer, and the bulk metal layer is a bulk molybdenum layer.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWINGS

To easily identify the discussion of any particular element or act, the most significant digit or digits in a reference number refer to the figure number in which that element is first introduced.

A more complete understanding of the embodiments of the present disclosure may be derived by referring to the detailed description and claims when considered in connection with the following illustrative figures.

Figure 1:
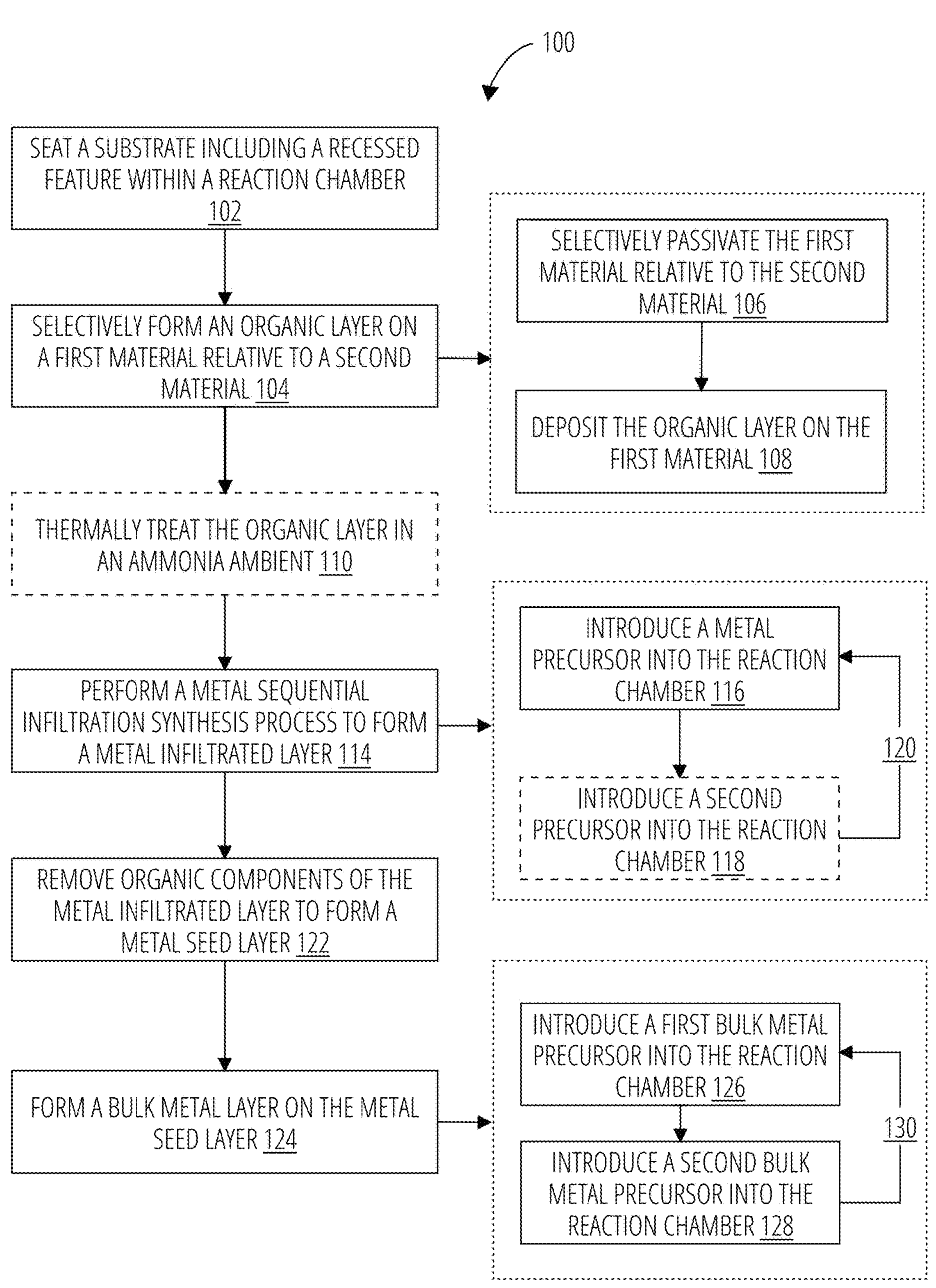
FIG. 1 illustrates an exemplary method in accordance with one or more embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

The description of exemplary embodiments of methods and compositions provided below is merely exemplary and is intended for purposes of illustration only. The following description is not intended to limit the scope of the disclosure or the claims. Moreover, recitation of multiple embodiments having indicated features or steps is not intended to exclude other embodiments having additional features or steps or other embodiments incorporating different combinations of the stated features or steps.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas. Precursors and reactants can be gasses. Exemplary seal gasses include noble gasses, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material. Further, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e., ceramic fibers or polymer fibers). Continuous substrates may also comprise carriers or sheets upon which non-continuous substrates are mounted.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate and/or may be or may become embedded in a device manufactured on that substrate. A film or layer may comprise material or a layer with pinholes and/or isolated islands. A film or layer may be at least partially continuous. A film or layer may be patterned, e.g., subdivided, and may be comprised in a plurality of semiconductor devices. A film or layer may be selectively grown on some parts of a substrate, and not on others.

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es). A pulse can comprise exposing a substrate to a precursor or reactant. This can be done, for example, by introducing a precursor or reactant to a reaction chamber in which the substrate is present. Additionally, or alternatively, exposing the substrate to a precursor can comprise moving the substrate to a location in a substrate processing system in which the reactant or precursor is present.

Generally, for ALD processes, during each cycle, a precursor is introduced into a reaction chamber and is chemisorbed onto a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, a "precursor" includes a gas or a material that can become gaseous and that can be represented by a chemical formula that includes an element which may be incorporated during a deposition process as described herein. In addition, the terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may be an element or a compound that is not incorporated into the resulting compound or element to a significant extent. However, a reactant may also contribute to the resulting compound or element in certain embodiments.

As used herein, a "structure" can be or include a substrate as described herein. Structures can include one or more layers overlying or within the substrate, such as one or more layers formed according to a method as described herein. Full devices or partial device portions can be included within or on structures.

As used herein, the term "recessed feature" may refer to an opening or cavity disposed between surfaces of a non-planar surface. For example, the term "recessed feature" may refer to an opening or cavity disposed between opposing sidewalls or protrusions extending vertically from the surface of a substrate or opposing inclined sidewalls of an indentation extending vertically into the surface of a substrate.

As used herein, the term "seam" may refer to a void line or one or more separated voids formed by the abutment of edges formed in a gap-fill metal. The presence of a "seam" can be confirmed using high magnification microscopy methods, such as, for example, scanning transmission electron microscopy (STEM), and transmission electron microscopy (TEM), wherein if observations reveals a clear vertical void line or one or more vertical voids in a recessed feature filled with a gap-fill metal then a "seam" is deemed to be present.

A number of example materials are given throughout the embodiments of the current disclosure, it should be noted that the chemical formulas given for each of the example materials should not be construed as limiting and that the non-limiting example materials given should not be limited by a given example stoichiometry.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments. In some cases, percentages indicate herein can be relative or absolute percentages.

In the specification, it will be understood that the term "on" or "over" may be used to describe a relative location relationship. Another element, film or layer may be directly on the mentioned layer, or another layer (an intermediate layer) or element may be intervened therebetween, or a layer may be disposed on a mentioned layer but not completely cover a surface of the mentioned layer. Therefore, unless the term "directly" is separately used, the term "on" or "over" will be construed to be a relative concept. Similarly, to this, it will be understood the term "under," "underlying," or "below" will be construed to be relative concepts.

Various embodiments of the present disclosure relate to methods of filling a recessed feature on a substrate employing metal sequential infiltration synthesis processes and related structures formed by such methods.

Turning to the figures, FIG. 1 illustrates an exemplary process 100. In brief, process 100 comprises seating a substrate including a recessed feature within a reaction chamber (step 102). The recessed feature includes a bottom surface, a sidewall surface, and a top surface. The bottom surface comprises a first material and the sidewall surface comprises a second material, where the first material is different from the second material. An organic layer is subsequently selectively formed on the first material relative to the second material (e.g., on the bottom surface of the recessed feature relative to a sidewall surface of the recessed feature) (step 104). The organic layer is then subjected to a metal sequential infiltration synthesis process to introduce metal species into the organic layer forming a metal infiltrated layer (step 114). Subsequently the organic components of the metal infiltrated layer are removed (step 122) forming a metal seed layer on the bottom surface of the recessed feature (i.e., on the first material). The metal seed layer is employed as a nucleation layer thereby allowing the formation of a bulk metal layer on the metal seed layer (step 124). The bulk metal layer fills the recessed feature from the "bottom-up" and in doing so fills the recessed feature without the formation of a seam.

In greater detail, the present disclosure provides methods for filling a recessed feature on a substrate. In particular, the methods disclosed fill a recessed feature by a "bottom-up gap-fill" process where the recessed feature is filled by a metal gap-fill material initially from the bottom surface of the recessed feature. The benefits of "bottom-up gap-fill" processes can include the mitigation, or even elimination, of the formation of a seam within the metal gap-fill material. In addition, the methods disclosed herein can fill a recessed feature including dissimilar materials in the base of the recessed feature (i.e., the bottom surface) versus the sidewall surfaces and/or top surfaces. Such selective metal gap-fill processes can greatly simplify semiconductor device and integrated circuit fabrication by removing the need for additional lithography and etching steps, for example.

Figure 2:
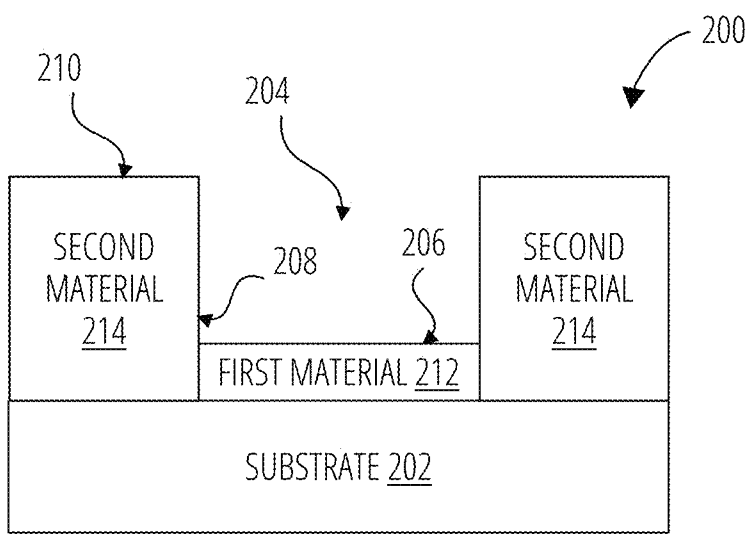
FIG. 2 illustrates a view of a structure formed in accordance with one or embodiments of the disclosure.

In accordance with examples of the disclosure, FIG. 2 illustrates a structure 200 including a substrate 202 (as described in detail above) and a recessed feature 204. In some embodiments, structure 200 may comprises a portion of a device structure, such as, a partially fabricated device structure. In such embodiments, the structure 200 may comprises a partially fabricated logic device, memory device, integrated circuit, and the like. Although structure 200 is illustrated as including a single recessed feature 204 it should be appreciated that the methods provided are not so limited, and substrates including a plurality of recessed features can be filled by the methods disclosed herein. It should also be noted that the cross-sectional profile of the recessed feature 204 illustrated in FIG. 2 is exemplary and that the methods disclosed herein encompass the filing of recessed features with alternative cross-sectional profiles, including, but not limited to, curved, scalloped, V-shaped, tapered, re-entrant, as well as through-silicon-via structures. The recessed feature 204 can also comprise a high aspect ratio feature, such as, for example, a trench structure, a vertical gap, and/or a fin structure. When referring to recessed features having a high aspect ratio, the recessed feature 204 has an aspect ratio (e.g., the ratio of height to width) that is greater than 2:1, greater than 5:1, greater than 10:1, greater than 25:1, greater than 50:1, or greater than 100:1.

In accordance with examples of the disclosure, the exemplary recessed feature 204 of FIG. 2 includes a bottom surface 206, a sidewall surface 208, and a top surface 210. In such examples, the bottom surface 206 which comprises a first material 212 and the sidewall surface (or sidewall surfaces) which comprises a second material 214, where the first material 212 is different to the second material 214. As illustrated in FIG. 2, the full extent of the bottom surface 206 comprises the first material 212. However, in some embodiments, a portion of the bottom surface 206 comprises the first material 212 (e.g., a middle portion of the bottom surface) and the remaining portion of the bottom surface comprises a different material (e.g., such as the second material 214). Further, as illustrated in FIG. 2 the top surface 210 comprises the second material 214. However, in some embodiments the top surface 210 can include one or more dissimilar materials other than the second material 214 and/or first material 212.

In accordance with examples of the disclosure, the first material 212 (i.e., the material at the bottom of the recessed feature 204) comprises a germanium-containing layer. In such examples, the germanium-containing layer can comprise a silicon germanium layer. As used herein, the term "silicon germanium layer" can refer to a material layer comprising silicon and germanium and can be represented as $Si_{1-x}Ge_x$ wherein $1 \geq x \geq 0$, or $0.8 \geq x \geq 0.1$, or $0.6 \geq x \geq 0.2$, or materials comprising silicon and germanium having compositions as set forth herein. In addition, the term "silicon germanium" can be represented as SiGe and can further include one or more dopants such as boron, for example. In some embodiments, the first material comprises a SiGe layer having a germanium composition greater than 0.01, greater than 0.05, greater than 0.1, greater than 0.2, greater than 0.3, greater than 0.4, greater than, 0.5, greater than 0.6, or greater than 0.7. In some embodiments, the first material comprises a SiGe layer having a germanium composition less than 0.7, less than 0.6, less than 0.5, less than 0.4, less than 0.3, less than 0.2, or less than 0.1.

In accordance with examples of the disclosure, the second material 214 comprises a different material to the first material 212. As a non-limiting example, the first material 212 can comprise a silicon germanium layer and the second material 214 can comprise one or more of a silicon layer, a silicon oxide layer, and a silicon nitride layer. In some embodiments, the first material 212 comprises a silicon germanium layer having a first composition (e.g., a first germanium content) and the second material 212 comprises a silicon germanium layer having a second composition (e.g., a second germanium content), where the first composition is different to the second composition (i.e., the first material 212 has a different germanium content to the second material 214). In some embodiments, the first material 212 comprises a germanium containing material and the second material 214 comprises a non-germanium containing material, i.e., the second material is free, or substantially free, of elemental germanium.

Turning again to process 100 of FIG. 1, step 102 includes seating the substrate (e.g., as illustrated in FIG. 2 and including recessed feature 204) in a reaction chamber. The reaction chamber can be configured for performing all, or a portion, of the remaining steps of process 100. Reactors and associated reaction chamber(s) capable of performing the gap-fill process of the present disclosure can include reaction chambers configured to perform cyclical processes, such as, for example reaction chambers configured to perform atomic layer deposition (ALD), plasma-enhanced chemical vapor deposition (PEALD), cyclical chemical vapor deposition (CCVD), and sequential infiltration synthesis (SIS) type processes, as well as reaction chambers configured for the introduction of reactants in a cyclical manner. For example, in some embodiments, the gap-fill process of the present disclosure can be performed within a semiconductor processing apparatus configured for atomic layer deposition.

In some embodiments, the reaction chamber employed for performing the gap-fill processes of the present disclosure can be, or include, a reaction chamber of an atomic layer deposition reactor system configured to perform process steps of process 100 (FIG. 1). The reaction chamber can be a standalone reaction chamber or part of a cluster tool. The reaction chamber may be a batch processing tool. In some embodiments, a flow-type reactor may be utilized. In some embodiments, a showerhead-type reactor may be utilized. In some embodiments, a space divided reactor may be utilized. In some embodiments, a high-volume manufacturing-capable single wafer reactor may be utilized. In other embodiments, a batch reactor comprising multiple substrates may be utilized. For embodiments in which a batch reactor is used, the number of substrates may be in the range of 10 to 200, or 50 to 150, or even 100 to 130. In some embodiments, the reaction chamber can be configured as a thermal reactor—with no plasma excitation apparatus. In some embodiments, the reaction chamber can be configured for performing both plasma processes and thermal processes.

In accordance with examples of the disclosure, process 100 continues with step 104 which comprises selectively forming an organic layer on the first material relative to the second material. In other words, the organic layer is preferentially formed on the bottom surface of a recessed feature relative to the sidewall surface(s), as discussed in greater detail below. In accordance with examples of the disclosure the step of selectively forming the organic layer (step 104) can include a number of sub-steps, such as sub-step 106 and sub-step 108, as described in detail below.

In accordance with examples of the disclosure, the sub-step 106 comprises selectively passivating a surface of the second material (e.g., sidewall surfaces of the recessed feature) relative to a surface of the first material (e.g., bottom surfaces of the recessed feature). The selective passivation can be achieved by introducing a passivation agent into the reaction chamber and contacting the substrate with the passivating agent. For example, contacting the substrate with passivating agent can be performed at a temperature (e.g., a substrate temperature) of less than 400° C., such as at a temperature between 100° C. and 400° C., for example. In some embodiments, the passivating agent is pulsed into the reaction chamber. In such examples, selectively passivating the second material (e.g., the sidewall surface of the recessed feature) can include one or more pulses of passivating agent being introduced into the reaction chamber (either with or without intervening purge cycles). In some embodiments, the passivating agent can be introduced into the reaction chamber (i.e., pulsed in the reaction chamber) 1 or more times, 2 or more times, 5 or more times, 10 or more times, 20 or more times, 30 or more times, 40 or more times, or 50 or more times.

In some embodiments, the selectivity of the passivating agent is inherent, and no preceding or additional processing steps over those conveniently performed on a substrate are employed. For example, the selectivity of the passivating agent may be inherent to a certain material or material composition. As a non-limiting example, the passivating agent may selectively passivate the sidewall surface(s) of the recessed structure relative to the bottom surface of the recessed structure as a result of the bottom surface comprising a germanium-containing layer (e.g., SiGe) and the sidewall surface(s) comprising a non-germanium-containing layer (e.g., Si, $SiO_2$, $Si_3N_4$, and the like).

In some embodiments, the passivation agent comprises a vapor-phase passivating agent. In alternative embodiments, the passivation agent can include a liquid passivating agent, applied to the substrate by spin-coating methods, for example.

In accordance with examples of the disclosure, the passivating agent can comprise an alkylsilane. In such examples the passivating agent can comprise an alkylaminosilane. In particular examples, the alkylaminosilane comprises at least one of allyltrimethylsilane (TMS-A), 1,1,1-Trimethoxy-N,N-dimethylsilanamine, chlorotrimethylsilane (TMS-Cl), N-(trimethylsilyl)imidazole (TMS-Im), octadecyltrichlorosilane (ODTCS), hexamethyldisilazane (HMDS), N-(trimethylsilyl)dimethylamine (TMSDMA), 1,1,1-Trimethoxy-N,N-dimethylsilanamine, trimethylchlorosilane, and combinations thereof. In some embodiments, the alkylaminosilane comprises N-(trimethylsilyl)dimethylamine (TMSDMA) or 1,1,1-Trimethoxy-N,N-dimethylsilanamine.

In accordance with examples of the disclosure, after the sub-step of selectively passivating the sidewall surfaces of the recessed feature (sub-step 106), a subsequent sub-step comprises depositing an organic layer on the surface of the first material (e.g., on the bottom surface of the recessed feature).

The deposition of the organic layer according to the methods of present disclosure can be performed by a cyclic vapor deposition process. For example, the deposition of the organic layer may be a molecular layer deposition (MLD) process. The deposition of the organic layer comprises providing a first organic precursor into the reaction chamber and providing a second organic precursor into the reaction chamber. Providing a first organic precursor and providing a second organic precursor may define a deposition cycle. The deposition cycle may be repeated until a suitable thickness of the organic layer has been deposited on the surface of the first material (e.g., on the bottom surface of the recessed feature). The first and second organic precursors form the organic layer selectively on the first material, as a result of the previous passivation process. In some embodiments, the organic layer is an organic polymer. In some embodiments, the organic polymer comprises a polyimide.

Various precursors can be used to deposit the organic layer in sub-step 108. As a non-limiting example, the first organic precursor can include a diamine. In such examples, the first organic precursor can be, for example, 1,6-diaminohexane, 1,3-diaminopentane, triamine, such as tris(2-aminoethyl)amine, or a cyclic compound comprising at least two primary amine groups, such as 1,4-diaminocyclohexane or p-phenylenediamine. In some embodiments, the substrate is contacted with the first organic precursor before it is contacted with the second organic precursor. Thus, in some embodiments, the substrate may be contacted with a diamine before it is contacted with a second organic precursor. In some embodiments, the second organic precursor is capable of reacting with adsorbed species of the first organic precursor under the deposition conditions. For example, in some embodiments, the second organic precursor is an anhydride, such as furan-2,5-dione (maleic acid anhydride). The anhydride can be a dianhydride, e.g., pyromellitic dianhydride (PMDA). In some embodiments, the second organic precursor can be any other monomer with two reactive groups which will react with the first organic precursor.

In alternative examples of the disclosure the organic layer can be replaced with an inorganic layer. In such examples, the deposited layer to be subsequently infiltrated can comprise a metal oxide. In some embodiments, the metal oxide is formed by a selective deposition process including a metal reactant and an oxidizing agent. In alternative embodiments, the metal oxide is formed by infiltrating metal species into the organic layer wherein the oxygen within the organic layer reacts with the infiltrated metal to form the metal oxide.

The combination of the selective passivation (sub-step 106) and the deposition of the organic layer (sub-step 108) allows the organic layer to be formed selectivity on the first material (i.e., the bottom surface of the recessed feature) relative to the second material (i.e., the sidewall surfaces of the recessed feature). For example, in some embodiments, the selective passivation process results in a nucleation delay of the organic layer on the sidewalls of the recessed feature resulting in the selective formation of the organic layer on the bottom surface of the recessed feature.

When a material is formed or deposited selectively on a first surface of the substrate relative to a second surface of the substrate, selectivity can be given as a percentage calculated by [(deposition on first surface)-(deposition on second surface)]/(deposition on the first surface). When the material is deposited on the second surface, the calculation is reversed accordingly.

In some embodiments, selectivity of the organic layer formed on the first material (i.e., the bottom surface of the recessed feature) is at least about 30%. In some embodiments, selectivity is at least 50%. In some embodiments, selectivity is at least 75%, or greater than 85%. In some embodiments, selectivity is at least 90% or at least 93%. In some embodiments, selectivity is at least 95% or at least 98%. In some embodiments, selectivity is at least 99% or even at least 99.5%. In embodiments, the selectivity can change over the duration or thickness of a deposition. It should be noted that a partially selective process can result in a fully selective structure by a post-deposition etch that removes all of the deposited material from over the second material without removing the entirety of the deposited material from over the second material.

Deposition can be measured in any of a variety of ways. In some embodiments, deposition may be given as the measured thickness of the deposited material (e.g., the organic layer). In some embodiments, deposition may be given as the measured amount of deposited material. Sometimes selectivity, for example after treating one of at least two surfaces of a substrate with the passivating agent, may be measured as nucleation delay expressed as number of deposition cycles before deposition of the organic layer is observed on the different surfaces. In such cases, the term "selectivity window" can be used to describe the difference between the number of cycles on the different surfaces before deposition of the organic layer is observed.

Figure 3:
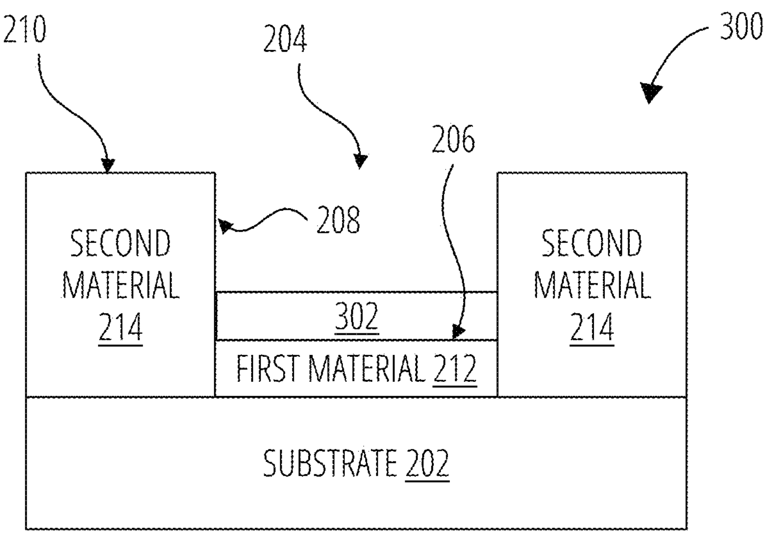
FIG. 3 illustrates a view of an additional structure formed in accordance with one or embodiments of the disclosure.

Selectively forming the organic layer as described above (i.e., step 104 and associated sub-steps) may be further illustrated with reference to FIG. 3. In accordance with examples of the disclosure, FIG. 3 illustrates a structure 300 which comprises the structure 200 (of FIG. 2) after having undergone the selective deposition of the organic layer. As illustrated in FIG. 3, the structure 300 includes an organic layer 302 disposed over (e.g., on) the first material 212, and particularly the organic layer is disposed on the bottom surface 206 of the recessed feature 204. In contrast, the organic layer 302 is not disposed over (e.g., on) the second material 214, and particularly the organic layer 302 is not disposed on the sidewall surfaces 208 of the recessed feature 204. In some embodiments, the top surface 210 of the recessed feature 204 is also free of the organic layer 302, as illustrated in FIG. 3.

After forming the organic layer on the bottom surface of the recessed feature (i.e., on the first material), the organic layer can optionally be thermally treated prior to being infiltrated with metal species. For example, a thermal treatment of the organic layer may increase the mass uptake of the organic layer, i.e., the thermal treatment increases the likelihood that the metal species will be infiltrated and retained in the organic layer. Therefore, in some embodiments, process 100 can optionally include a step of thermally treating the organic layer in an ammonia ambient (step 110). For example, the organic layer may be heated to a temperature of less than 500° C., less than 400° C., less than 300° C., less than 200° C., or between 200° C. and 500° C., in an ammonia ambient. In particular examples, the process 100 optional comprises thermally treating the organic layer in an ammonia ($NH_3$) ambient prior to performing the metal sequential infiltration synthesis process.

The embodiments of the disclosure further include forming a metal seed layer on the bottom surface of the recessed feature (i.e., on the first material). In brief, the metal seed layer is formed by introducing metal species (e.g., a plurality of metal species) into the previously formed organic layer. The introduction of the metal species into the organic layer can be achieved by optionally thermally treating the organic layer (as described above) and employing an infiltration process (e.g., a metal sequential infiltration synthesis process) to infuse metal atoms into the framework of the organic layer thereby forming a metal infiltrated layer. As a non-limiting examples, the metal sequential infiltration synthesis processes of the present disclosure can include the sorption of at least a portion of a metal precursor into the organic layer (e.g., the metal precursor dissolves and/or diffuses into the organic layer). The metal precursor then interacts with the organic layer (e.g., via reversible complex formation and/or irreversible chemical reactions) and this interaction between the metal precursor and the organic layer results in the entrapment of the metal species, provided from the metal precursor, within the organic layer forming the metal infiltrated layer. Subsequently the organic components of the metal infiltrated layer can be removed leaving a metal seed layer on the bottom surface of the recessed feature.

A metal sequential infiltration synthesis process (also referred to herein as a metal SIS process) according to the methods of the present disclosure is illustrated in FIG. 1 by step 114 which includes the sub-step 116 and the optional the sub-step 118. In accordance with examples of the disclosure, the metal SIS process (step 114) comprises, performing at least one infiltration cycle of the metal sequential infiltration synthesis process to introduce metal species (e.g., a plurality of metal species) into the organic layer thereby forming a metal infiltrated layer. In such examples, each infiltration cycle comprises at least introducing a metal precursor containing the metal species into the reaction chamber (sub-step 116). In some embodiments, each infiltration cycle can optionally include introducing a second precursor (e.g., an additional precursor and/or co-reactant) into the reaction chamber (sub-step 118). The metal precursor and the optional second precursor can be introduced into the reaction chamber by pulsing the precursors(s) into the reaction chamber wherein they contact the surfaces of the substrate, including the organic layer. The metal precursor and the optional second precursor can be purged from the reaction chamber—e.g., after each pulse and/or upon completion of sub-step 116, sub-step 118, and/or after each infiltration cycle. In some embodiments, the sub-steps 16 and 118 can be repeated as illustrated by SIS cycle loop 120. For example, an infiltration cycle can be performed 1 or more times, 2 or more times, 3 or more times, 5 or more times, 10 or more times, 25 or more times, or between 1 and 25 times. Further, sub-steps 116 and 118 can be initiated and/or terminated in any order. Yet further, each infiltration cycle can include multiple repetitions of sub-step 116 and/or sub-step 118 prior to proceeding to the subsequent sub-step (s) of the infiltration cycle. In some embodiments, each infiltration can also include one or more additional sub-steps which can performed during each infiltration cycle or during select infiltration cycles of the sequence.

As described above, the metal precursor contains the metal species that are introduced (e.g., infiltrated) into the organic layer and which will subsequently form the metal seed layer.

In accordance with examples of the disclosure, the metal precursor contains metal species from one or more transition metals. In some embodiments, the metal precursor contains metal species selected from a group consisting of titanium, aluminum, niobium, tungsten, tantalum, cobalt, ruthenium, and molybdenum. In a particular example, the metal precursor contains titanium species (i.e., elemental titanium). In an additional example, the metal precursor contains molybdenum species (i.e., elemental molybdenum). In some embodiments, the metal precursor comprises a metal halide precursor. In some embodiments, the metal halide precursor comprises at least of a metal fluoride, a metal chloride, a metal bromide, or metal bromide. In some embodiments, the metal chloride precursor comprises a metal oxychloride precursor. In some embodiments, the metal precursor comprises a metal-organic precursor, where the metal-organic precursor contains one or more of the metal species disclosed above. In particular examples, the metal species are introduced directly without requiring the introduction of a second precursor (e.g., an additional precursor or co-reactant). In such examples, the step of introducing the metal precursor into the reaction chamber (sub-step 116) may be performed multiple times, with or without intervening purge cycles. As a non-limiting example, the metal precursor can contain titanium species which are infiltrated into the organic layer by introducing into the reaction chamber at least one of $TiCl_4$, $TiI_4$, $TiF_4$, or a titanium metal-organic precursor. As a further non-limiting example, the metal precursor can contain molybdenum species which are infiltrated into the organic layer by introducing into the reaction chamber at least one of $MoCl_5$, $MoF_6$, $MoO_2Cl_2$, $MoOCl_4$, or a molybdenum metal-organic precursor.

In accordance with additional examples of the disclosure, a second precursor (e.g., an additional precursor or co-reactant) is optionally introduced into the reaction by sub-step 118, wherein the second precursor comprises a reducing agent. In such examples, the reducing agent can include forming gas ($H_2$+$N_2$), ammonia ($NH_3$), hydrazine ($N_2H_4$), molecular hydrogen ($H_2$), hydrogen atoms (H), a hydrogen plasma, alcohols, aldehydes, carboxylic acids, boranes, or amines.

Figure 4:
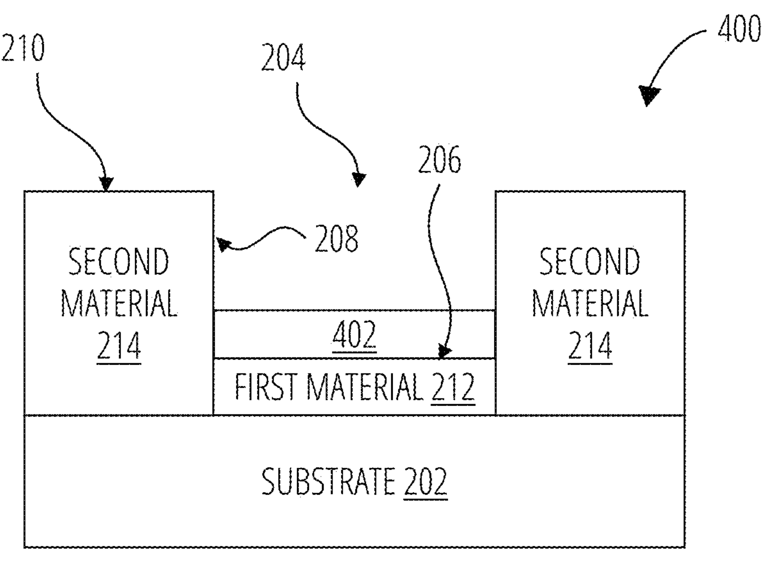
FIG. 4 illustrates a view of a further structure formed in accordance with one or embodiments of the disclosure.

Forming the metal infiltrated layer by the optional thermal process (step 110) and the metal SIS process (step 112) as described above may be further illustrated with reference to FIG. 4. In accordance with examples of the disclosure, FIG. 4 illustrates a structure 400 which comprises the structure 300 (of FIG. 3) after forming the metal infiltrated layer. As illustrated in FIG. 4, the structure 400 includes a metal infiltrated layer 402 disposed over (e.g., on) the first material 212, and particularly the metal infiltrated layer 402 is disposed on the bottom surface 206 of the recessed feature 204. In contrast, the metal infiltrated layer 402 is not disposed over (e.g., on) the second material 214, and particularly the metal infiltrated layer 402 is not disposed on the sidewall surfaces 208 of the recessed feature 204, excluding the portion of the sidewall surfaces/second material directly at the bottom surface 206 of the recessed feature 204. In some embodiments, the top surface 210 of the recessed feature 204 is also free of the metal infiltrated layer 402, as illustrated in FIG. 4.

Having introduced the metal species into the organic layer to form the metal infiltrated layer, the methods of the disclosure can continue by removing organic components in the metal infiltrated layer. Removing the organic components of the infiltrated layer whilst maintaining the metal species (e.g., all or a portion of) results in the formation of a metal seed layer on the bottom surface (i.e., on the first material) of the recessed feature.

Therefore, in accordance with examples of the disclosure, process 100 includes removing organic components of the metal infiltrated layer thereby forming a metal seed layer on the bottom surface of the recessed feature (step 122). In such examples, the process for removing the organic components comprises a thermal process and/or a plasma process.

In some embodiments, a thermal process for removing the organic components comprises heating the metal infiltrated layer to a temperature (i.e., a substrate temperature) between 80 and 600° C., between 100 to 400° C., or between 120 and 300° C.

In some embodiments, a plasma process (e.g., a plasma etch process) for removing the organic components comprises, providing a plasma within the reaction chamber which contacts the metal infiltrated layer and removes (i.e., etches) the organic components. An oxygen or hydrogen containing plasma may be used to remove the organic components of the metal infiltrated layer. For example, a plasma generator can be used to excite oxygen species for effective removal of the organic components. The plasma generator may be supplied with oxygen ($O_2$) or hydrogen ($H_2$), or alternatively a gas mixture of hydrogen ($H_2$) or oxygen ($O_2$) and nitrogen ($N_2$). In particular examples, the plasma etchant for removing the organic components of the metal infiltrated layer can comprise at least one of oxygen excited species or nitrogen excited species.

As previously stated, the removal of the organic components of the metal infiltrated layer forms a metal seed layer on the bottom surface of the recessed feature. The metal seed layer is composed of the metal species previously introduced into organic layer during the metal SIS process (step 114). Therefore, the metal seed layer can comprise one or more of the metals described above. For example, in some embodiments, the metal seed layer comprises a transition metal. In some embodiments, the metal seed layer is composed of one or metals from a group consisting of titanium, aluminum, niobium, tungsten, tantalum, cobalt, ruthenium, and molybdenum. In a particular example, the metal seed layer comprises titanium (i.e., a titanium seed layer). In an additional example, the metal seed layer comprises molybdenum (i.e., a molybdenum seed layer).

Figure 5:
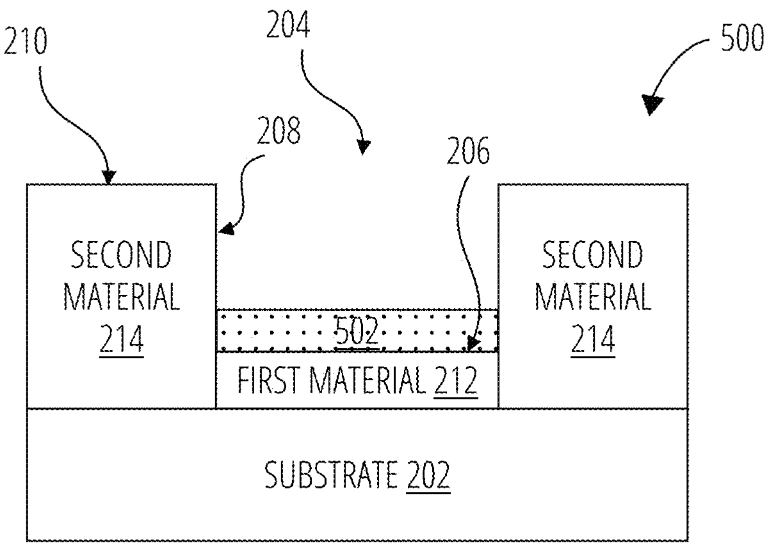
FIG. 5 illustrates a view of, yet a further structure formed in accordance with one or embodiments of the disclosure.

Forming the metal seed layer by removing the organic components from the metal infiltrated layer (via step 122), as described above, may be further illustrated with reference to FIG. 5. In accordance with examples of the disclosure, FIG. 5 illustrates a structure 500 which comprises the structure 400 (of FIG. 4) after forming the metal seed layer. As illustrated in FIG. 5, the structure 500 includes a metal seed layer 502 disposed over (e.g., on) the first material 212 at the bottom of the recessed feature 204, and particularly the metal seed layer 502 is disposed on the bottom surface 206 of the recessed feature 204. In some embodiments, the metal seed layer 502 is a continuous layer, as illustrated in FIG. 5. In alternative embodiments, the metal seed layer 502 is a discontinuous layer. In some embodiments, the metal seed layer 502 is disposed overall, or a majority, of the first material 212, as illustrated in FIG. 5. In alternative embodiments, the metal seed layer 502 is disposed over a portion of the first material 212. As a non-limiting example, the metal seed layer 502 can be disposed primarily on a middle portion of first material 212 at the base of the recessed feature 204 (not shown).

Having formed the metal seed layer on the first material at the bottom surface of the recessed feature, the methods of the disclosure can continue by depositing a bulk metal layer directly on the metal seed layer, wherein the bulk metal layer fills the recessed feature. In some embodiments, the bulk metal layer is deposited employing a cyclical deposition process, wherein the bulk metal layer fills the recessed feature without the formation of a seam. In some embodiments, the bulk metal layer is deposited by a selective cyclical deposition process.

Therefore, in accordance with examples of the disclosure, the formation of the bulk metal layer comprises depositing a bulk metal layer by a cyclical deposition process (step 124 and associated sub-step 126 and 128 of process 100 in FIG. 1) In some embodiments, the cyclical deposition processes comprise an atomic layer deposition process. In particular examples, the cyclical deposition process is a selective deposition process (e.g., selective ALD), where the bulk metal layer is selectively and/or preferentially deposited within the recessed feature thereby enabling bottom-up gap-fill of the recessed feature. In such examples, the selectivity the cyclical deposition process can be enabled by the inherent surface properties of bulk metal deposition on the metal seed layer relative to the other surfaces in and proximate to the recessed feature. As a non-limiting example, the selective cyclical deposition process can deposit the bulk metal layer selectively on the metal seed layer relative to other materials of the substrate such as silicon, silicon oxide, and/or silicon nitride. In some embodiments, selectivity of the bulk metal layer formed on the metal seed layer (i.e., the bottom surface of the recessed feature) is at least about 30%. In some embodiments, selectivity is at least 50%. In some embodiments, selectivity is at least 75%, or greater than 85%. In some embodiments, selectivity is at least 90% or at least 93%. In some embodiments, selectivity is at least 95% or at least 98%. In some embodiments, selectivity is at least 99% or even at least 99.5%. In embodiments, the selectivity can change over the duration or thickness of a deposition. It should be noted that a partially selective process can result in a fully selective structure by a post-deposition etch that removes all of the deposited material from over the second material without removing the entirety of the deposited material from within the recessed feature.

In accordance with examples of the disclosure, and referring to FIG. 1, the step of selectively depositing the bulk metal layer comprises performing at least one deposition cycle of a cyclical deposition process (step 124), where each deposition cycle includes, introducing a first bulk metal precursor into the reaction chamber to form an absorbed metal species on the metal seed layer (sub-step 126) and introducing a second bulk metal precursor into the reaction chamber to react with the absorbed species to form the bulk metal layer on the metal seed layer (sub-step 128). Sub-steps 126 and 128 can be repeated as illustrated by deposition cycle loop 130. In particular examples, the deposition cycle (e.g., sub-step 126 and 128) includes intervening purging cycles. In addition, examples, the deposition cycle (e.g., sub-step 126 and 128) is repeated until sufficient bulk metal layer has been selectively deposited to fill the recessed feature. In such examples, the recessed feature is filled from the bottom-up (i.e., initiating from the metal seed layer) and by doing so the bulk metal layer disposed within and filling the recessed feature is free of a seam. In additional embodiments, sub-steps 126 and 128 can be initiated and/or terminated in any order. Yet further, selective cyclical deposition process (step 124) can include one or more (e.g., 1-10 or 1-5) sub-steps sub-step 126 and/or 128 prior to proceeding to the other of step 126 or 128. In some embodiments, each deposition cycle can also include one or more additional sub-steps which can performed during each deposition cycle or during select deposition cycles of the sequence.

In accordance with examples of the disclosure, the bulk metal layer can comprise at least one metal as previously described with reference to the metal seed layer. In particular examples, the bulk metal layer titanium, aluminum, niobium, tungsten, tantalum, cobalt, ruthenium, and molybdenum. In such examples, the first bulk metal precursor can include the precursors described with reference to the metal precursor employed during the metal SIS process (114). For example, in particular examples, the first bulk metal precursor comprises at least one of a metal halide (e.g., a metal chloride, or a metal oxychloride), and a metal-organic. As a non-limiting example, the bulk metal layer is titanium and the first bulk metal precursor is at least one of $TiCl_4$, $TiI_4$, $TiF_4$, and a titanium metal-organic precursor. As a further non-limiting example, the bulk metal layer is molybdenum and the first bulk metal precursor is at least one of $MoCl_5$, $MoF_6$, $MoO_2Cl_2$, $MoOCl_4$, and a molybdenum metal-organic precursor. In accordance with examples of the disclosure, the second bulk metal precursor (e.g., an additional precursor or co-reactant) comprises a reducing agent. In such examples, the reducing agent can include forming gas ($H_2$+$N_2$), ammonia ($NH_3$), hydrazine ($N_2H_4$), molecular hydrogen ($H_2$), hydrogen atoms (H), a hydrogen plasma, alcohols, aldehydes, carboxylic acids, boranes, or amines.

As described above, the metal seed layer can be employed as a nucleation layer (or a series of nucleation sites) for the bulk metal layer.

In some embodiments, the metal seed layer is a first metal, and the bulk metal layer is the same metal (i.e., also the first metal). In particular example, the metal seed layer is a titanium seed layer, and the bulk metal layer is also a bulk titanium layer. In an additional example, the metal seed layer is a molybdenum seed layer, and the bulk metal layer is also a molybdenum layer, i.e., a bulk molybdenum layer. In an additional example, the metal seed layer comprises a ruthenium-containing layer (e.g., ruthenium tantalum nitride) and the bulk metal layer is also a ruthenium-containing layer.

In some embodiments, the metal seed layer is a first metal, and the bulk metal layer is a different second metal (i.e., the metal seed layer and bulk metal layer are composed of different metals). In a particular example, the metal seed layer is a titanium layer, and the bulk metal layer is also a molybdenum layer. In an additional example, the metal seed layer comprises a ruthenium-containing layer (e.g., ruthenium tantalum nitride) and the bulk metal layer is a non-ruthenium-containing layer.

Figure 6:
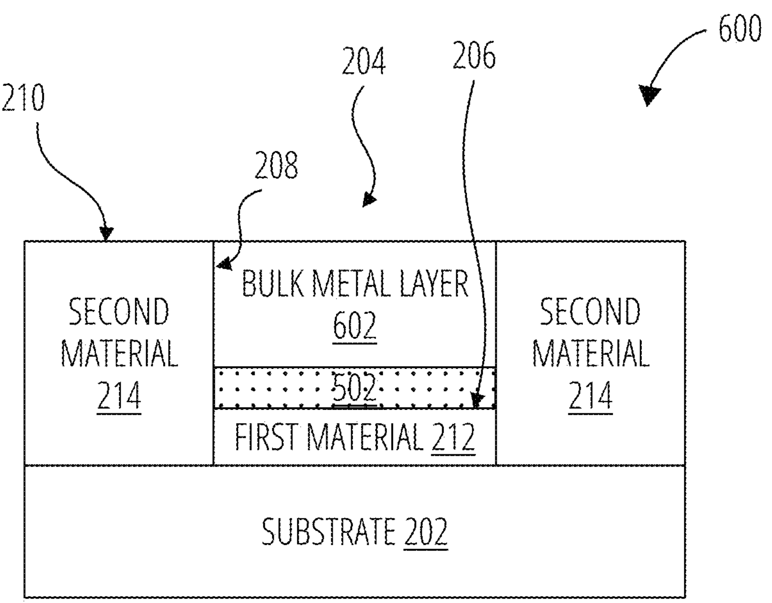
FIG. 6 illustrates a view of yet a further a structure formed in accordance with one or embodiments of the disclosure.

Forming the bulk metal layer by the selective cyclical deposition process (step 124), as described above, may be further illustrated with reference to FIG. 6. In accordance with examples of the disclosure, FIG. 6 illustrates a structure 600 which comprises the structure 500 (of FIG. 5) after forming the bulk metal layer. As illustrated in FIG. 6, the structure 600 includes a bulk metal layer 602 disposed over (e.g., on) the metal seed layer. In addition, the bulk metal layer 602 is illustrated as fully filling the recessed feature 204 without the formation of a seam within the recessed feature 204 as well as without deposition on the top surfaces 210 of the recessed feature.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

What is claimed is:

1. A method of filling a recessed feature on a substrate, the method comprising:

seating the substrate including the recessed feature within a reaction chamber, the recessed feature comprising a sidewall surface, a top surface, and a bottom surface, wherein the bottom surface comprises a first material and the sidewall surface comprises a second material different from the first material;

selectively forming an organic layer on the first material relative to the second material;

performing a metal sequential infiltration synthesis process to introduce metal species into the organic layer thereby forming a metal infiltrated layer;

removing organic components of the metal infiltrated layer thereby forming a metal seed layer on the bottom surface; and forming a bulk metal layer directly on the metal seed layer, wherein the bulk metal layer fills the recessed feature.

2. The method of claim 1, wherein selectively forming the organic layer on the first material relative to the second material comprises;

selectively passivating a surface of the second material relative to a surface of the first material by introducing a passivating agent into the reaction chamber; and depositing the organic layer on the surface of the first material.

3. The method of claim 2, wherein the organic layer is selectively formed with a selectivity greater than 50 percent.

4. The method of claim 3, wherein the passivating agent comprises an alkylaminosilane.

5. The method of claim 4, wherein the alkylaminosilane comprises at least one of allyltrimethylsilane (TMS-A), 1,1,1-Trimethoxy-N,N-dimethylsilanamine, chlorotrimethylsilane (TMS-Cl), N-(trimethylsilyl)imidazole (TMS-Im), octadecyltrichlorosilane (ODTCS), hexamethyldisilazane (HMDS), N-(trimethylsilyl)dimethylamine (TMSDMA), 1,1,1-Trimethoxy-N,N-dimethylsilanamine, trimethylchlorosilane, and combinations thereof.

6. The method of claim 1, further comprising thermally treating the organic layer in an ammonia ($NH_3$) ambient prior to performing the metal sequential infiltration synthesis process.

7. The method of claim 1, wherein performing the metal sequential infiltration synthesis process comprises introducing a metal precursor into the reaction chamber, the metal precursor containing the metal species.

8. The method of claim 7, wherein the metal species is selected from a group consisting of titanium, aluminum, niobium, tungsten, tantalum, cobalt, ruthenium, and molybdenum.

9. The method of claim 7, wherein performing the metal sequential infiltration synthesis process further comprises introducing a second precursor into the reaction chamber, the second precursor comprising hydrogen or ammonia.

10. The method of claim 1, wherein removing organic components of the metal infiltrated layer comprises a plasma etch process.

11. The method of claim 1, wherein forming the bulk metal layer directly on the metal seed layer comprises depositing the bulk metal layer by a cyclical deposition process.

12. The method of claim 11, wherein the bulk metal layer comprises titanium, aluminum, niobium, tungsten, tantalum, cobalt, ruthenium, and molybdenum.

13. The method of claim 11, wherein the bulk metal layer is the same as the metal seed layer.

14. The method of claim 11, wherein the bulk metal layer is different to the metal seed layer.

15. A method of bottom-up gap filling of a recessed feature on a substrate, the method comprising:

seating the substrate including the recessed feature within a reaction chamber, the recessed feature including a bottom surface comprising a silicon germanium layer and a sidewall surface comprising a silicon layer;

passivating the sidewall surface comprising the silicon layer by introducing a passivating agent into the reaction chamber;

depositing an organic layer on the silicon germanium layer disposed at the bottom surface of the recessed feature;

performing at least one infiltration cycle of a sequential infiltration synthesis (SIS) sequence to introduce metal species into the organic layer thereby forming a metal infiltrated layer, wherein each infiltration cycle comprises introducing a metal precursor containing the metal species into the reaction chamber, the metal species selected from a group consisting of titanium, aluminum, niobium, tungsten, tantalum, cobalt, ruthenium, and molybdenum;

removing organic components of the metal infiltrated layer thereby forming a metal seed layer on the silicon germanium layer disposed at the bottom surface of the recessed feature; and depositing a bulk metal layer directly on the metal seed layer employing a cyclical deposition process, wherein the bulk metal layer fills the recessed feature without the formation of a seam.

16. The method of claim 15, wherein the passivating agent comprises an alkylaminosilane selected from a group consisting of allyltrimethylsilane (TMS-A), 1,1,1-Trimethoxy-N,N-dimethylsilanamine, chlorotrimethylsilane (TMS-Cl), N-(trimethylsilyl)imidazole (TMS-Im), octadecyltrichlorosilane (ODTCS), hexamethyldisilazane (HMDS), N-(trimethylsilyl)dimethylamine (TMSDMA), 1,1,1-Trimethoxy-N,N-dimethylsilanamine, trimethylchlorosilane, and combinations thereof.

17. The method of claim 16, wherein the organic layer comprises a polyimide.

18. The method of claim 17, further comprising thermally annealing the organic layer in an ammonia ($NH_3$) ambient prior to performing at least one infiltration cycle of the sequential infiltration synthesis (SIS) sequence.

19. The method of claim 18, wherein the metal seed layer is a molybdenum seed layer, and the bulk metal layer is a bulk molybdenum layer.

20. The method of claim 18, wherein the metal seed layer is a titanium seed layer, and the bulk metal layer is a bulk molybdenum layer.

* * * * *